US009899455B2

(12) United States Patent
Won et al.

(10) Patent No.: US 9,899,455 B2
(45) Date of Patent: Feb. 20, 2018

(54) ORGANIC LIGHT EMITTING DIODE DISPLAY

(71) Applicant: Samsung Display Co., Ltd., Yongin-si, Gyeonggi-do (KR)

(72) Inventors: Byeong-Hee Won, Hwaseong-si (KR); Eun Jin Sung, Yongin-si (KR); Jong In Baek, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 113 days.

(21) Appl. No.: 15/148,972

(22) Filed: May 6, 2016

(65) Prior Publication Data

US 2016/0336381 A1 Nov. 17, 2016

(30) Foreign Application Priority Data

May 13, 2015 (KR) ........................ 10-2015-0066759

(51) Int. Cl.
*H01L 51/50* (2006.01)
*H01L 27/32* (2006.01)
(Continued)

(52) U.S. Cl.
CPC ...... *H01L 27/3213* (2013.01); *H01L 27/3216* (2013.01); *H01L 51/5215* (2013.01);
(Continued)

(58) Field of Classification Search
None
See application file for complete search history.

(56) References Cited

U.S. PATENT DOCUMENTS 7,843,123 B2 * 11/2010 Mizuno ................. C09K 11/06
                                                           313/501
9,276,228 B2 *  3/2016 Seo ..................... H01L 51/5016
(Continued)

FOREIGN PATENT DOCUMENTS

| JP | 2008-225179 A   | 9/2008 |
|----|-----------------|--------|
| KR | 10-2012-0039874 A | 4/2012 |
| KR | 10-2014-0085072 A | 7/2014 |

OTHER PUBLICATIONS

Extended European Search Report (EESR) dated Jan. 10, 2017 for European Patent Application No. EP 16 169 703.2 which shares priority of Korean Patent Application No. KR 10-2015-0066759 with subject U.S. Appl. No. 15/148,972. The EESR cites references previously made of record in the subject application.
(Continued)

*Primary Examiner* — Michael Lebentritt
(74) *Attorney, Agent, or Firm* — Knobbe Martens Olson & Bear LLP

(57) ABSTRACT

An organic light emitting diode display includes: a first organic light emitting element configured to emit light having a first wavelength; and a second organic light emitting element configured to emit light having a second wavelength substantially shorter than the first wavelength. The first organic light emitting element includes a first electrode, and the second organic light emitting element includes a second electrode having substantially higher reflectance for the light having the second wavelength than the first electrode.

18 Claims, 8 Drawing Sheets

(51) Int. Cl.
   *H01L 51/52* (2006.01)
   *H01L 51/56* (2006.01)
(52) U.S. Cl.
   CPC ...... *H01L 51/5218* (2013.01); *H01L 51/5231* (2013.01); *H01L 51/5234* (2013.01); *H01L 51/5265* (2013.01); *H01L 51/56* (2013.01); *H01L 2251/558* (2013.01)

(56) References Cited

U.S. PATENT DOCUMENTS

| | | | |
|---|---|---|---|
| 9,343,691 B2* | 5/2016 | Seo | H01L 51/5215 |
| 2008/0284324 A1* | 11/2008 | Chun | H01L 27/3211 |
| | | | 313/504 |
| 2009/0261715 A1 | 10/2009 | Sung et al. | |
| 2009/0267490 A1 | 10/2009 | Birnstock et al. | |
| 2011/0304263 A1* | 12/2011 | Xia | H01L 27/3211 |
| | | | 313/504 |
| 2012/0299031 A1 | 11/2012 | Shiratori | |
| 2014/0183464 A1 | 7/2014 | Baek et al. | |
| 2014/0183480 A1* | 7/2014 | Lee | H01L 51/5012 |
| | | | 257/40 |
| 2015/0333295 A1* | 11/2015 | Kim | H01L 51/5278 |
| | | | 257/40 |
| 2016/0268353 A1* | 9/2016 | Sawabe | H01L 51/5016 |
| 2016/0268533 A1* | 9/2016 | Lin | H01L 27/3211 |
| 2017/0033306 A1* | 2/2017 | Song | H01L 51/5265 |
| 2017/0033309 A1* | 2/2017 | Song | H01L 27/3213 |
| 2017/0117330 A1* | 4/2017 | Jiang | H01L 27/322 |
| 2017/0194382 A1* | 7/2017 | Lee | H01L 27/3213 |
| 2017/0194388 A1* | 7/2017 | Kim | H01L 51/5278 |
| 2017/0271430 A1* | 9/2017 | Yan | H01L 27/3276 |

OTHER PUBLICATIONS

Partial European Search Report dated Sep. 26, 2016 for European Patent Application No. EP 16 169 703.2, which cites the above-identified references numbered 1-4 and which shares priority of Korean Patent Application No. KR 10-2015-0066759 with subject U.S. Appl. No. 15/148,972.

* cited by examiner

ORGANIC LIGHT EMITTING DIODE DISPLAY

RELATED APPLICATIONS

This application claims priority to and the benefit of Korean Patent Application No. 10-2015-0066759 filed in the Korean Intellectual Property Office on May 13, 2015, the entire contents of which are incorporated herein by reference.

BACKGROUND

1. Field

The described technology relates generally to an organic light emitting diode display.

2. Discussion of the Related Technology

A display device is a device displaying an image, and an organic light emitting diode display has been recently highlighted.

Since the organic light emitting diode display has self-luminance characteristics and does not require a separate light source unlike a liquid crystal display device, a thickness and a weight thereof may be reduced. In addition, the organic light emitting diode display exhibits high quality characteristics such as reduced consumption power, increased luminance, fast response speed, and the like.

In general, the organic light emitting diode display includes an array of organic light emitting elements that emit light having different wavelengths per a pixel, which is a minimum unit displaying the image. The above-mentioned organic light emitting element includes a first electrode, an organic layer emitting light, and a second electrode which are sequentially stacked, wherein the organic layer is deposited on the first electrode using a mask.

The above information disclosed in this Background section is only for enhancement of understanding of the background of the described technology and therefore it may contain information that does not form the prior art that is already known in this country to a person of ordinary skill in the art.

SUMMARY

The described technology provides an organic light emitting diode display having advantages of improving light emission efficiency of each of a plurality of organic light emitting elements that emit lights having different wavelengths, even though the number of masks used for depositing an organic layer is not increased.

One aspect of the invention provides an organic light emitting diode display device, which may comprise: a first organic light emitting element configured to emit light having a first wavelength; and a second organic light emitting element configured to emit light having a second wavelength substantially shorter than the first wavelength, wherein the first organic light emitting element comprises a first electrode, and wherein the second organic light emitting element comprises a second electrode having substantially higher reflectance for the light having the second wavelength than the first electrode.

In the foregoing device, the first and second electrodes may comprise first and second reflective layers, respectively, wherein the second reflective layer of the second electrode is formed of a material different from that of the first reflective layer of the first electrode. The first organic light emitting element and the second organic light emitting element may respectively comprise first and second organic light emitting layers that are formed of the same material and have substantially the same thickness, the first and second organic light emitting layers being disposed over the first electrode and the second electrode, respectively. The first and second organic light emitting layers may comprise a blue light emitting material. The first organic light emitting element and the second organic light emitting element may further comprise a common electrode disposed over the first and second organic light emitting layers, wherein a first distance between the first electrode and the common electrode may be substantially the same as a second distance between the second electrode and the common electrode.

Still in the foregoing device, the first reflective layer of the first electrode may comprise silver (Ag), and the second reflective layer of the second electrode may comprise aluminum (Al). The first electrode may comprise a first transparent conductive layer disposed over the first reflective layer, and wherein the second electrode does not comprise an intervening transparent conductive layer between the second reflective layer and the second organic light emitting layer. The organic light emitting diode display of claim 6, wherein the first electrode comprises a first transparent conductive layer disposed over the first reflective layer, and wherein the second electrode may further comprise a second transparent conductive layer disposed over the second reflective layer. The first transparent conductive layer and the second transparent conductive layer may comprise different transparent conductive materials. A thickness of the second reflective layer may be substantially greater than that of the first reflective layer.

Yet in the foregoing device, the light having the first wavelength and the light having the second wavelength may be blue light. The first wavelength may be about 459 nm to about 490 nm, and the second wavelength may be about 440 nm to about 458 nm. The first organic light emitting element may further comprise: a first organic light emitting layer disposed over the first electrode; and a common electrode disposed over the first organic light emitting layer, wherein the second organic light emitting element may further comprise: a second organic light emitting layer disposed over the second electrode; and the common electrode disposed over the second organic light emitting layer. The first organic light emitting layer and the second organic light emitting layer may be formed of the same material and have substantially the same thickness. A distance between the first electrode and the common electrode may be substantially the same as a distance between the second electrode and the common electrode. The organic light emitting diode display device may further comprise: a third organic light emitting element configured to emit light having a third wavelength longer than the first wavelength; and a fourth organic light emitting element configured to emit light having a fourth wavelength longer than the third wavelength. The third organic light emitting element and the fourth organic light emitting element may respectively comprise third and fourth organic light emitting layers having thicknesses different from each other.

Another aspect of the invention provides an organic light emitting diode display device, which may comprise: a first organic light emitting element configured to emit light having a first wavelength; and a second organic light emitting element configured to emit light having a second wavelength substantially shorter than the first wavelength, wherein the first organic light emitting element comprises a first reflective layer and a first electrode that comprises a first transparent conductive layer and is disposed over the first reflective layer, and wherein the second organic light emitting element comprises a second reflective layer and a second electrode that is disposed over the second reflective layer and comprises a second transparent conductive layer having a thickness substantially smaller than that of the first transparent conductive layer.

In the foregoing device, the first reflective layer and the second reflective layer may be formed of the same material. The first organic light emitting element and the second organic light emitting element may respectively comprise first and second organic light emitting layers that are formed of the same material and have substantially the same thickness, the first and second organic light emitting layers being disposed over the first electrode and the second electrode, respectively.

An embodiment provides an organic light emitting diode display including: a first organic light emitting element emitting light having a first wavelength; and a second organic light emitting element emitting light having a second wavelength shorter than the first wavelength, wherein the first organic light emitting element includes a first electrode, and the second organic light emitting element includes a second electrode having higher reflectance for the light having the second wavelength than the first electrode.

The second electrode may include a material different from that of the first electrode.

Each of the first organic light emitting element and the second organic light emitting element may further include the same organic light emitting layer having the same thickness disposed on each of the first electrode and the second electrode.

The organic light emitting layer may include a blue light emitting material.

Each of the first organic light emitting element and the second organic light emitting element may further include a common electrode disposed on the organic light emitting layer, and a distance between the first electrode and the common electrode, and a distance between the second electrode and the common electrode may be the same as each other The first electrode may include silver Ag, and the second electrode may include aluminum Al.

The first electrode may include a first reflective layer including silver Ag, and a first transparent conductive layer disposed on the first reflective layer, and the second electrode may include a second reflective layer including aluminum Al.

The second electrode may further include a second transparent conductive layer disposed on the second reflective layer.

Each of the first transparent conductive layer and the second transparent conductive layer may include different transparent conductive materials.

A thickness of the second reflective layer may be thicker than that of the first reflective layer.

The light having the first wavelength and the light having the second wavelength may be blue lights different from each other.

The first wavelength may be 459 nm to 490 nm, and the second wavelength may be 440 nm to 458 nm.

The first organic light emitting element may further include: a first organic light emitting layer disposed on the first electrode; and a common electrode disposed on the first organic light emitting layer, and the second organic light emitting element may further include: a second organic light emitting layer disposed on the second electrode; and the common electrode disposed on the second organic light emitting layer.

Each of the first organic light emitting layer and the second organic light emitting layer may be the same organic layer having the same thickness.

A distance between the first electrode and the common electrode may be the same as a distance between the second electrode and the common electrode.

The organic light emitting diode display may further include a third organic light emitting element emitting light having a third wavelength longer than the first wavelength; and a fourth organic light emitting element emitting light having a fourth wavelength longer than the third wavelength.

The third organic light emitting element and the fourth organic light emitting element may include different organic light emitting layers having thicknesses different from each other.

Another embodiment provides an organic light emitting diode display including: a first organic light emitting element emitting light having a first wavelength; and a second organic light emitting element emitting light having a second wavelength shorter than the first wavelength, wherein the first organic light emitting element includes a first reflective layer and a first electrode including a first transparent conductive layer disposed on the first reflective layer, and the second organic light emitting element includes a second reflective layer and a second electrode disposed on the second reflective layer and including a second transparent conductive layer having a thickness thinner than that of the first transparent conductive layer.

The first reflective layer may include the same material as that of the second reflective layer.

Each of the first organic light emitting element and the second organic light emitting element may further include the same organic light emitting layer having the same thickness disposed on each of the first electrode and the second electrode.

According to an embodiment, even though the number of masks used for depositing the organic layer is not increased, the organic light emitting diode display capable of improving light emission efficiency of each of the plurality of organic light emitting elements that emit lights having different wavelengths may be provided.

DETAILED DESCRIPTION

Figure 1:
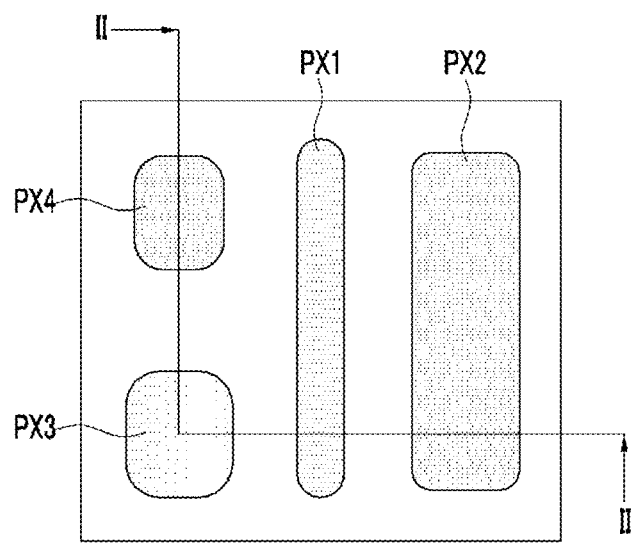
FIG. 1 is a plan view showing pixels of an organic light emitting diode display according to an embodiment.

Hereinafter, embodiments will be described in detail with reference to the accompanying drawings so that those skilled in the art may easily practice the present invention. The present invention may be implemented in various different forms and is not limited to the embodiments described in the present specification.

Accordingly, the drawings and description are to be regarded as illustrative in nature and not restrictive. Like reference numerals designate like elements throughout the specification.

In several embodiments, components having the same configuration will be described representatively in an embodiment by the same reference numerals. In embodiments other than an embodiment, configurations different from those of an embodiment will be described.

In addition, since sizes and thicknesses of the respective components shown in the drawings are arbitrarily shown for the convenience of explanation, the present invention is not necessarily limited to those shown in the drawings.

In the drawings, the thickness of layers, films, panels, regions, etc., are exaggerated for clarity. In addition, in the drawings, thicknesses of some layers and regions are exaggerated for convenience of explanation. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. In addition, throughout the specification, when an element is referred to as being "on" another element, it means that the element is positioned on or below of a target portion, and does not necessarily mean that the element is positioned at an upper side based on a gravity direction.

Hereinafter, an organic light emitting diode display according to an embodiment will be described with reference to FIGS. 1 and 2.

FIG. 1 is a plan view showing pixels of an organic light emitting diode display according to an embodiment. FIG. 1 is a plan view showing a portion of the organic light emitting diode display according to an embodiment.

As shown in FIG. 1, an organic light emitting diode display 1000 according to an embodiment includes a first pixel PX1, a second pixel PX2, a third pixel PX3, and a fourth pixel PX4. The pixel means a smallest unit displaying an image. In embodiments, each of the first pixel PX1, the second pixel PX2, the third pixel PX3, and the fourth pixel PX4 may be referred to as a sub-pixel, and these subpixels (the first pixel PX1, the second pixel PX2, the third pixel PX3, and the fourth pixel PX4 described above) may constitute one single pixel which is included in an array of pixels, but is not limited thereto. In embodiments, the first pixel PX1, the second pixel PX2, the third pixel PX3, and the fourth pixel PX4 may respectively constitute one single pixel. Alternatively, two or three of the first pixel PX1, the second pixel PX2, the third pixel PX3, and the fourth pixel PX4 may constitute one single pixel.

The first pixel PX1 emits a first blue light and includes a first organic light emitting element and a pixel circuit connected to the first organic light emitting element. Here, the first blue light may be sky blue light having a first wavelength of 459 nm, but is not limited thereto.

The second pixel PX2 emits a second blue light and includes a second organic light emitting element and a pixel circuit connected to the second organic light emitting element. Here, the second blue light may be deep blue light having a second wavelength of 440 nm to 458 nm, but is not limited thereto.

The third pixel PX3 emits green light having a third wavelength and includes a third organic light emitting element and a pixel circuit connected to the third organic light emitting element.

The fourth pixel PX4 emits red light having a fourth wavelength and includes a fourth organic light emitting element and a pixel circuit connected to the fourth organic light emitting element.

Figure 2:
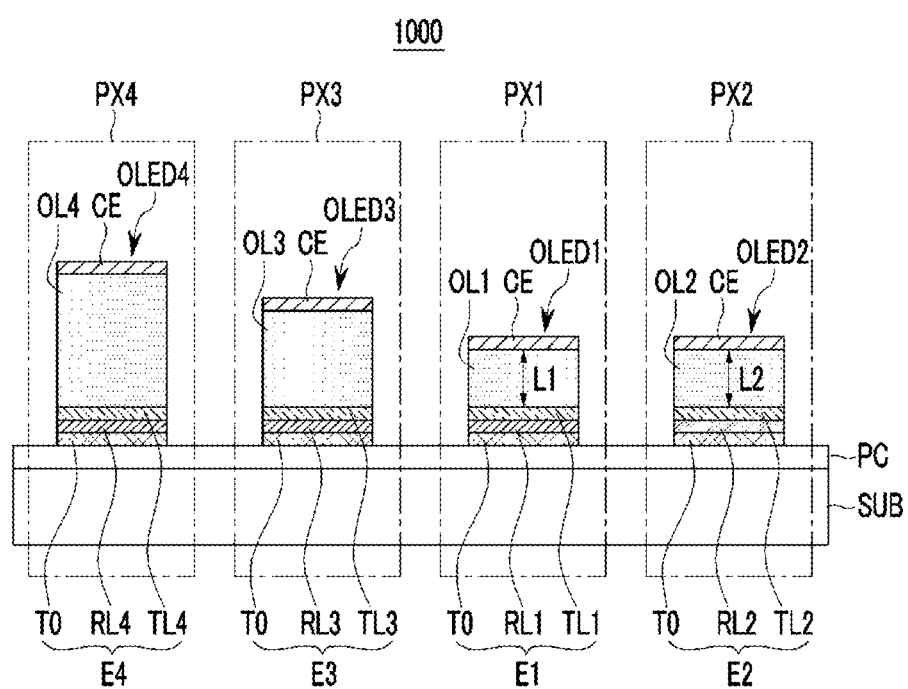
FIG. 2 is a cross-sectional view taken along a line II-II of FIG. 1.

FIG. 2 is a cross-sectional view taken along a line II-II of FIG. 1.

As shown in FIG. 2, the first pixel PX1 includes a first organic light emitting element OLED1 and a pixel circuit PC formed on a substrate SUB connected to the first organic light emitting element OLED1. In embodiments, the substrate SUB may be flexible, stretchable, foldable, bendable, or rollable, but is not limited thereto. The substrate SUB is flexible, stretchable, foldable, bendable, or rollable, such that the entire organic light emitting diode display 1000 may be flexible, stretchable, foldable, bendable, or rollable. In alternative embodiments, the substrate may be rigid or non-flexible.

In addition, the pixel circuit PC may include a wiring structure, transistors and at least one capacitor that are disposed on the substrate SUB. The wiring structure includes electrically conductive lines including one or more scan lines, data lines, driving power lines, common power lines, and the like. The two or more thin film transistors TFTs connected to the lines may be provided for one organic light emitting element. The pixel circuit PC may have various known structures.

The first organic light emitting element OLED1 may emit a first blue light having a first wavelength which may be about 459 nm to about 490 nm, and include a first electrode E1, a first organic light emitting layer OL1, and a common electrode CE.

The first electrode E1 may be an anode which is connected to the pixel circuit PC and which is a hole injection electrode, but is not limited thereto. Alternatively, the first electrode E1 may be a cathode, which is an electron injection electrode. The first electrode E1 includes a transparent oxide layer TO, a first reflective layer RL1, and a first transparent conductive layer TL1.

The transparent oxide layer TO may be formed of a single layer or multilayer of light transmissive conductive material including one or more of indium tin oxide (ITO), indium zinc oxide (IZO), and the like.

The first reflective layer RL1 includes silver Ag, which is a metal having high reflectance. The first reflective layer RL1 reflects light emitted from the first organic light emitting layer OL1 in a direction of the common electrode CE.

The first transparent conductive layer TL1 may be formed of a single layer or multilayer of light transmissive conductive material including one or more of indium tin oxide (ITO), amorphous indium tin oxide (a-ITO), indium zinc oxide (IZO), and the like, and may include a material having a high work function.

The first organic light emitting layer OL1 includes at least a main light emitting layer that emits light. In embodiments, the first organic light emitting layer OL1 may further include a hole injection layer, a hole transport layer, an auxiliary layer, an electronic transport layer, and an electronic injection layer. The first organic light emitting layer OL1 includes a blue light emitting material. In embodiments, the first organic light emitting layer OL1 has a thickness which defines a first distance L1 between the first electrode E1 and the common electrode CE. In embodiments, the first distance L1 may be an optimal distance at which constructive interference occurs in response to the blue light having the wavelength of about 440 nm to about 490 nm.

The common electrode CE may be the cathode, which is the electron injection electrode, but is not limited thereto. In alternative embodiments, the common electrode CE may be the anode, which is the hole injection electrode. The common electrode CE may have a shape which is extended throughout the first organic light emitting element OLED1, a second organic light emitting element OLED2, a third organic light emitting element OLED3, and a fourth organic light emitting element OLED4. The common electrode CE may include a single layer or multilayer of light transmissive conductive material or a light semi-transmissive conductive material including one or more of indium tin oxide (ITO), indium zinc oxide (IZO), aluminum Al, silver Ag, and the like.

The second pixel PX2 includes the second organic light emitting element OLED2 and a pixel circuit PC formed on the substrate SUB connected to the second organic light emitting element OLED2.

The second organic light emitting element OLED2 may emit a second blue light having a second wavelength which may be about 440 nm to about 458 nm shorter than the first blue light having the first wavelength which is emitted by the first organic light emitting element OLED1, and include a second electrode E2, a second organic light emitting layer OL2, and a common electrode CE.

In embodiments, the second blue light having the second wavelength which is emitted by the second organic light emitting element OLED2 is blue light different from the first blue light having the first wavelength which is emitted by the first organic light emitting element OLED1.

The second electrode E2 may be the anode which is connected to the pixel circuit PC and which is the hole injection electrode, but is not limited thereto. In alternative embodiments, the second electrode E2 may be the cathode, which is the electron injection electrode. The second electrode E2 includes a transparent oxide layer TO, a second reflective layer RL2, and a second transparent conductive layer TL2.

The transparent oxide layer TO may be formed of a single layer or multilayer of light transmissive conductive material including one or more of indium tin oxide (ITO), indium zinc oxide (IZO), and the like.

The second reflective layer RL2 includes aluminum Al, which is a metal having higher reflectance for the light having the second wavelength than the first electrode E1 of the first organic light emitting element OLED1. The second reflective layer RL2 reflects light emitted from the second organic light emitting layer OL2 in a direction of the common electrode CE.

In embodiments, the second reflective layer RL2 of the second electrode E2 is formed of a material different material from that of the first reflective layer RL1 of the first electrode E1. In one embodiment, the first reflective layer RL2 is formed of aluminum Al while the first reflective layer RL1 is formed of silver Ag. Since the second electrode E2 includes the material different from that of the first electrode E1, the second electrode E2 may be formed by using an additional process after a process of forming the first electrode E1, but is not limited thereto.

The second transparent conductive layer TL2 may be formed of a single layer or multilayer of light transmissive conductive material including one or more of indium tin oxide (ITO), amorphous indium tin oxide (a-ITO), indium zinc oxide (IZO), and the like, and may include a material having a high work function. The second transparent conductive layer TL2 may include the same material as that of the first transparent conductive layer TL1 of the first electrode E1, but is not limited thereto. Alternatively, the second transparent conductive layer TL2 may include a material different from that of the first transparent conductive layer TL1.

The second organic light emitting layer OL2 includes at least a main light emitting layer that emits light. In embodiments, the second organic light emitting layer OL2 may further include a hole injection layer, a hole transport layer, an auxiliary layer, an electronic transport layer, and an electronic injection layer. The second organic light emitting layer OL2 includes the same blue light emitting material as that of the first organic light emitting layer OL1. The second organic light emitting layer OL2 has substantially the same thickness as that of the first organic light emitting layer OL1, and as a result, the second electrode E2 and the common electrode CE are spaced from each other with a second distance L2 substantially the same as the first distance L1. Here, the second distance L2 may be an optimal distance at which constructive interference occurs in response to the blue light having the wavelength of about 440 nm to about 490 nm.

In embodiments, since the second organic light emitting layer OL2 has the same blue light emitting material as that of the first organic light emitting layer OL1 and has the same thickness as that of the first organic light emitting layer OL1 at the same time, the second organic light emitting layer OL2 may be formed simultaneously with the process of forming the first organic light emitting layer OL1. Thereby, each of the first organic light emitting layer OL1 and the second organic light emitting layer OL2 may be simultaneously deposited on each of the first electrode E1 and the second electrode E2 by using one deposition process using one mask. This acts as a factor reducing time and costs for manufacturing the organic light emitting diode display.

The common electrode CE may be the cathode, which is the electron injection electrode, but is not limited thereto. In alternative embodiments, the common electrode CE may be the anode, which is the hole injection electrode. The common electrode CE may have a shape which is extended throughout the first organic light emitting element OLED1, the second organic light emitting element OLED2, the third organic light emitting element OLED3, and the fourth organic light emitting element OLED4. The common electrode CE may include a single layer or multilayer of light transmissive conductive material or a light semi-transmissive conductive material including one or more of indium tin oxide (ITO), indium zinc oxide (IZO), aluminum Al, silver Ag, and the like.

The third pixel PX3 includes the third organic light emitting element OLED3 and a pixel circuit PC formed on the substrate SUB connected to the third organic light emitting element OLED3.

The third organic light emitting element OLED3 emits green light having a third wavelength longer than the first wavelength, and includes a third electrode E3, a third organic light emitting layer OL3, and a common electrode CE.

The third electrode E3 may be the anode which is connected to the pixel circuit PC and which is the hole injection electrode, but is not limited thereto. In alternative embodiments, the third electrode E3 may be the cathode, which is the electron injection electrode. The third electrode E3 includes a transparent oxide layer TO, a third reflective layer RL3, and a third transparent conductive layer TL3.

The transparent oxide layer TO may be formed of a single layer or multilayer of light transmissive conductive material including one or more of indium tin oxide (ITO), indium zinc oxide (IZO), and the like.

The third reflective layer RL3 may include silver Ag, which is the same metal as that of the first reflective layer RL1 of the first electrode E1, but is not limited thereto. In alternative embodiments, the third reflective layer RL3 may include one or more of silver Ag and aluminum Al. The third reflective layer RL3 reflects light emitted from the third organic light emitting layer OL3 in a direction of the common electrode CE.

In embodiments, the third reflective layer RL3 of the third electrode E3 is formed of a material the same as that of the first reflect layer RL1 of the first electrode E1. Since the third electrode E3 includes the same material as that of the first electrode E1, the third electrode E3 may be formed simultaneously with the first electrode E1 by the process of forming the first electrode E1.

In alternative embodiments, the third reflective layer RL3 of the third electrode E3 is formed of a material the same as that of the second reflective layer RL2 of the second electrode E2. Since the third electrode E3 includes the same material as that of the second electrode E2, the third electrode E3 may be formed simultaneously with the second electrode E2 by the process of forming the second electrode E2, but is not limited thereto.

The third transparent conductive layer TL3 may be formed of a single layer or multilayer of light transmissive conductive material including one or more of indium tin oxide (ITO), amorphous indium tin oxide (a-ITO), indium zinc oxide (IZO), and the like, and may include a material having a high work function. The third transparent conductive layer TL3 may include the same material as that of the first transparent conductive layer TL1 of the first electrode E1.

The third organic light emitting layer OL3 includes at least a main light emitting layer that emits light. In embodiments, the third organic light emitting layer OL3 may further include a hole injection layer, a hole transport layer, an auxiliary layer, an electronic transport layer, and an electronic injection layer. The second organic light emitting layer OL2 includes a green light emitting material. The third organic light emitting layer OL3 has a thickness substantially greater than that of the first organic light emitting layer OL1, and as a result, the third electrode E3 and the common electrode CE are spaced from each other with a distance longer than the first distance L1. Here, the distance between the third electrode E3 and the common electrode CE may be an optimal distance at which constructive interference occurs in response to the green light.

The common electrode CE may be the cathode, which is the electron injection electrode, but is not limited thereto. In alternative embodiments, the common electrode CE may be the anode, which is the hole injection electrode.

The fourth pixel PX4 includes the fourth organic light emitting element OLED4 and a pixel circuit PC formed on the substrate SUB connected to the fourth organic light emitting element OLED4.

The fourth organic light emitting element OLED4 emits red light having a fourth wavelength longer than the third wavelength, and includes a fourth electrode E4, a fourth organic light emitting layer OL4, and a common electrode CE.

The fourth electrode E4 may be the anode which is connected to the pixel circuit PC and which is the hole injection electrode, but is not limited thereto. In alternative embodiments, the fourth electrode E4 may be the cathode, which is the electron injection electrode. The fourth electrode E4 includes a transparent oxide layer TO, a fourth reflective layer RL4, and a fourth transparent conductive layer TL4.

The transparent oxide layer TO may be formed of a single layer or multilayer of light transmissive conductive material including one or more of indium tin oxide (ITO), indium zinc oxide (IZO), and the like.

The fourth reflective layer RL4 may include silver Ag, which is the same metal as that of the first reflective layer RL1 of the first electrode E1, but is not limited thereto. In alternative embodiments, the fourth reflective layer RL4 may include one or more of silver Ag and aluminum Al. The fourth reflective layer RL4 reflects light emitted from the fourth organic light emitting layer OL4 in a direction of the common electrode CE.

In embodiments, the fourth reflective layer RL4 of the fourth electrode E4 is formed of a material the same as that of the first reflective layer RL1 of the first electrode E1. Since the fourth electrode E4 includes the same material as that of the first electrode E1, the fourth electrode E4 may be formed simultaneously with the first electrode E1 by the process of forming the first electrode E1.

In alternative embodiments, the fourth reflective layer RL4 of the fourth electrode E4 is formed of a material the same as that of the second reflective layer RL2 of the second electrode E2. Since the fourth electrode E4 includes the same material as that of the second electrode E2, the fourth electrode E4 may be formed simultaneously with the second electrode E2 by the process of forming the second electrode E2, but is not limited thereto.

The fourth transparent conductive layer TL4 may be formed of a single layer or multilayer of light transmissive conductive material including one or more of indium tin oxide (ITO), amorphous indium tin oxide (a-ITO), indium zinc oxide (IZO), and the like, and may include a material having a high work function. The fourth transparent conductive layer TL4 may include the same material as that of the first transparent conductive layer TL1 of the first electrode E1.

The fourth organic light emitting layer OL4 includes at least a main light emitting layer that emits light. In embodiments, the fourth organic light emitting layer OL4 may further include a hole injection layer, a hole transport layer, an auxiliary layer, an electronic transport layer, and an electronic injection layer. The fourth organic light emitting layer OL4 includes a red light emitting material. The fourth organic light emitting layer OL4 has a thickness substantially greater than that of the third organic light emitting layer OL3, and as a result, the fourth electrode E4 and the common electrode CE are spaced from each other with a distance longer than the distance between the third electrode E3 and the common electrode CE. Here, the distance between the fourth electrode E4 and the common electrode CE may be an optimal distance at which constructive interference occurs in response to the red light.

The common electrode CE may be the cathode, which is the electron injection electrode, but is not limited thereto. In alternative embodiments, the common electrode CE may be the anode, which is the hole injection electrode.

Hereinafter, an effect of the organic light emitting diode display according to an embodiment described above will be described with reference to FIGS. 3 and 4.

Figure 3:
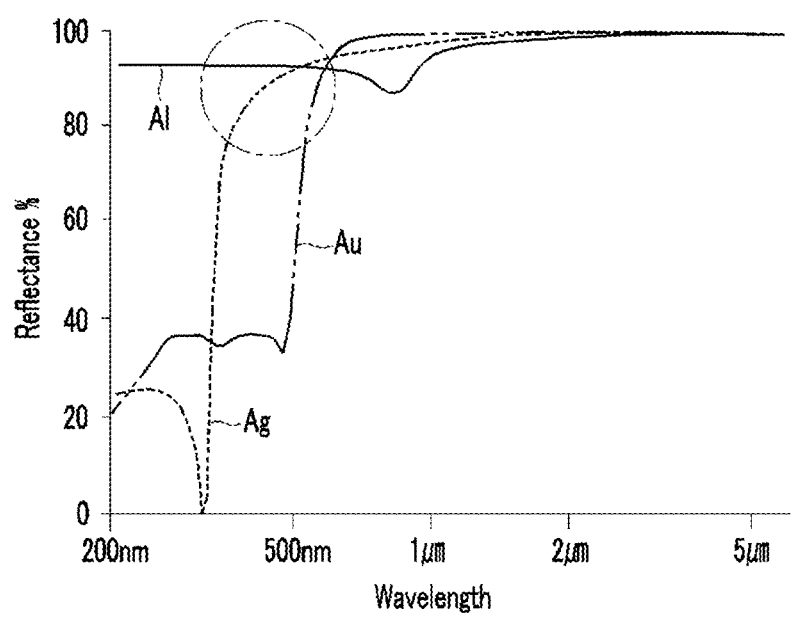
FIG. 3 is a graph showing reflectance of each metal material according to a wavelength of light.

FIG. 3 is a graph showing reflectance of each metal material according to a wavelength of light.

As shown in FIG. 3, it may be seen that reflectance of aluminum Al is higher than that of silver Ag in the range of a light wavelength of 500 nm or less. Inventors of the present invention have invented embodiments by taking accounting of unique characteristics of the above-mentioned metal material.

Since each of the first organic light emitting layer OL1 and the second organic light emitting layer OL2 of each of the first organic light emitting element OLED1 and the second organic light emitting element OLED2 includes the same blue light emitting material, light emitted from each of the first organic light emitting layer OL1 and the second organic light emitting layer OL2 is the blue light having substantially the same wavelength.

In addition, since each of the first organic light emitting layer OL1 and the second organic light emitting layer OL2 has the same thickness, the first distance L1 between the first electrode E1 and the common electrode CE is equal to the second distance L2 between the second electrode E2 and the common electrode CE. Therefore, the blue light emitted from each of the first organic light emitting layer OL1 and the second organic light emitting layer OL2 needs to be reinforced to the same high purity blue light by the constructive interference between the first electrode E1 and the common electrode CE and between the second electrode E2 and the common electrode CE to be viewed to the outside through the common electrode CE. However, since the first reflective layer RL1 of the first electrode E1 includes silver Ag having low reflectance at 500 nm or less and the second reflective layer RL2 of the second electrode E2 includes aluminum Al having high reflectance at 500 nm or less, the first organic light emitting element OLED1 emits the first blue light, which is the sky blue light having the first wavelength of about 459 nm to about 490 nm, and the second organic light emitting element OLED2 emits the second blue light, which is the deep blue light having the second wavelength of about 440 nm to about 458 nm shorter than the first wavelength.

Figure 4:
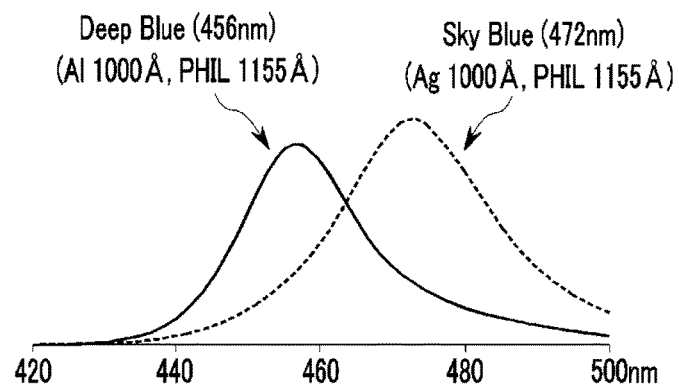
FIG. 4 is a graph illustrating an effect of the organic light emitting diode display according to an embodiment.

The inventors of the present invention have performed an experiment in order to confirm those described above, and results of the above-mentioned experiment have been shown in FIG. 4.

FIG. 4 is a graph illustrating an effect of the organic light emitting diode display according to an embodiment. In the graph of FIG. 4, an x axis represents a wavelength of light and a y axis represents intensity of light.

As shown in FIG. 4, a hole injection layer PHIL of each of the first organic light emitting layer OL1 of the first organic light emitting element OLED1 and the second organic light emitting layer OL2 of the second organic light emitting element OLED2 has been formed to have substantially the same thickness of about 1155 Å, the first reflective layer RL1 of the first electrode E1 of the first organic light emitting element OLED1 has been formed to include silver Ag having a thickness of about 1000 Å, and the second reflective layer RL2 of the second electrode E2 of the second organic light emitting element OLED2 has been formed to include aluminum Al having a thickness of about 1000 Å. As a result, the first organic light emitting element OLED1 has emitted the sky blue light having a wavelength of 472 nm, and the second organic light emitting element OLED2 has emitted the deep blue light having a wavelength of 456 nm.

As such, in the organic light emitting diode display 1000 according to an embodiment, even though each of the first organic light emitting layer OL1 of the first organic light emitting element OLED1 and the second organic light emitting layer OL2 of the second organic light emitting element OLED2 includes the same blue light emitting material and has the same thickness at the same time, since the first electrode E1 includes silver Ag having high reflectance and the second electrode E2 includes aluminum Al having higher reflectance for light having the second wavelength than silver Ag of the first electrode E1, the first organic light emitting element OLED1 emits the first blue light, which is the sky blue light having the first wavelength of 459 nm to 490 nm, and the second organic light emitting element OLED2 emits the second blue light, which is the deep blue light having the second wavelength of 440 nm to 458 nm shorter than the first wavelength.

In embodiments, since the second organic light emitting layer OL2 has the same blue light emitting material as that of the first organic light emitting layer OL1 and has the same thickness as that of the first organic light emitting layer OL1 at the same time, the second organic light emitting layer OL2 may be formed simultaneously with the process of forming the first organic light emitting layer OL1. As a result, each of the first organic light emitting layer OL1 and the second organic light emitting layer OL2 may be simultaneously deposited on each of the first electrode E1 and the second electrode E2 by using one deposition process using one mask.

Since this acts as a factor reducing total manufacturing time and manufacturing costs of the organic light emitting diode display, even though the organic light emitting diode display 1000 includes the first organic light emitting element OLED1 and the second organic light emitting element OLED2 that emit different blue lights, it is possible to provide the organic light emitting diode display 1000 capable of reducing the manufacturing time and manufacturing costs.

In short, even though the number of masks used for depositing the organic light emitting layer is not increased, the organic light emitting diode display 1000 capable of improving light emission efficiency of each of a plurality of organic light emitting elements that emit lights having different wavelengths is provided.

Hereinafter, an organic light emitting diode display according to another embodiment will be described with reference to FIG. 5. Portions which are different from the organic light emitting diode display according to an embodiment described above will be described.

Figure 5:
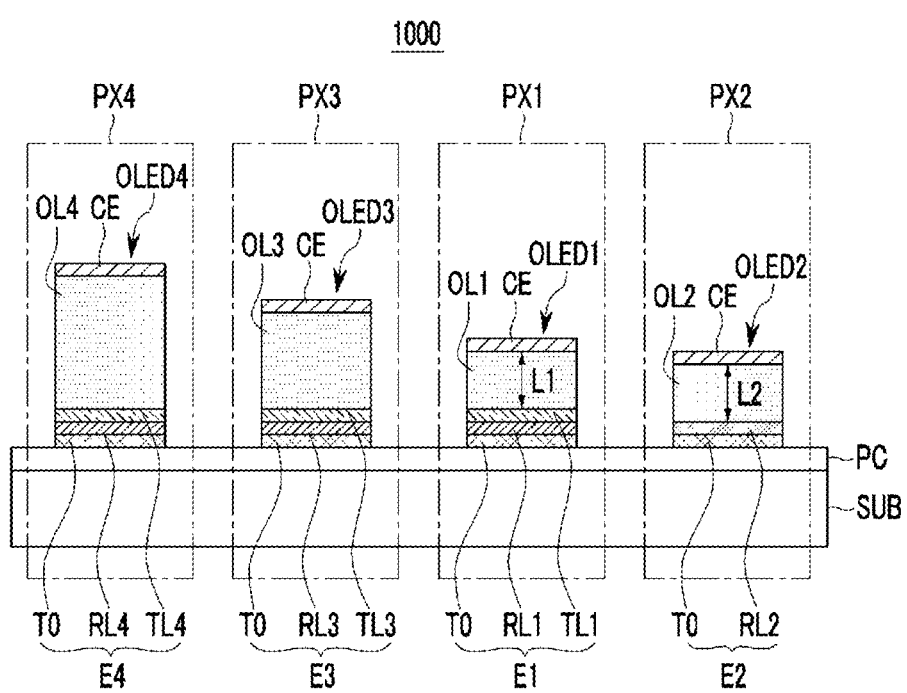
FIG. 5 is a cross-sectional view showing an organic light emitting diode display according to another embodiment.

FIG. 5 is a cross-sectional view showing an organic light emitting diode display according to another embodiment.

As shown in FIG. 5, the second organic light emitting element OLED2 of the organic light emitting diode display 1000 according to another embodiment emits the second blue light having the second wavelength which may be 440 nm to 458 nm shorter than the first blue light having the first wavelength which is emitted by the first organic light emitting element OLED1, and includes a second electrode E2, a second organic light emitting layer OL2, and a common electrode CE.

The second electrode E2 includes a transparent oxide layer TO and a second reflective layer RL2. In embodiments, the second organic light emitting layer OL2 may contact the second reflective layer RL2.

The second reflective layer RL2 includes aluminum Al, which is a metal having higher reflectance for the light having the second wavelength than the first electrode E1 of the first organic light emitting element OLED1. The second reflective layer RL2 reflects light emitted from the second organic light emitting layer OL2 in a direction of the common electrode CE.

In embodiments, the second reflective layer RL2 of the second electrode E2 is formed of aluminum Al while the reflective layer RL1 of the first electrode E1 is formed of silver Ag. Since the second electrode E2 includes the material different from that of the first electrode E1, the second electrode E2 may be formed by using an additional process after a process of forming the first electrode E1, but is not limited thereto.

The second organic light emitting layer OL2 includes at least a main light emitting layer that emits light. In embodiments, the second organic light emitting layer OL2 may further include a hole injection layer, a hole transport layer, an auxiliary layer, an electronic transport layer, and an electronic injection layer. The second organic light emitting layer OL2 includes the same blue light emitting material as that of the first organic light emitting layer OL1. The second organic light emitting layer OL2 has substantially the same one thickness as that of the first organic light emitting layer OL1, and as a result, the second electrode E1 and the common electrode CE are spaced from each other with a second distance L2 substantially the same as the first distance L1. Here, the second distance L2 may be an optimal distance at which constructive interference occurs in response to the blue light having the wavelength of 440 nm to 490 nm.

In embodiments, since the second organic light emitting layer OL2 has the same blue light emitting material as that of the first organic light emitting layer OL1 and has the same thickness as that of the first organic light emitting layer OL1 at the same time, the second organic light emitting layer OL2 may be formed simultaneously with the process of forming the first organic light emitting layer OL1. Thereby, each of the first organic light emitting layer OL1 and the second organic light emitting layer OL2 may be simultaneously deposited on each of the first electrode E1 and the second electrode E2 by using one deposition process using one mask. This acts as a factor reducing time and costs for manufacturing the organic light emitting diode display.

As such, in the organic light emitting diode display 1000 according to another embodiment, even though each of the first organic light emitting layer OL1 of the first organic light emitting element OLED1 and the second organic light emitting layer OL2 of the second organic light emitting element OLED2 includes the same blue light emitting material and has the same thickness at the same time, since the first electrode E1 includes silver Ag having high reflectance and the second electrode E2 includes aluminum Al having higher reflectance for light having the second wavelength than silver Ag of the first electrode E1, the first organic light emitting element OLED1 emits the first blue light, which is the sky blue light having the first wavelength of 459 nm to 490 nm, and the second organic light emitting element OLED2 emits the second blue light, which is the deep blue light having the second wavelength of 440 nm to 458 nm shorter than the first wavelength.

In embodiments, since the second organic light emitting layer OL2 has the same blue light emitting material as that of the first organic light emitting layer OL1 and has the same thickness as that of the first organic light emitting layer OL1 at the same time, the second organic light emitting layer OL2 may be formed simultaneously with the process of forming the first organic light emitting layer OL1. As a result, each of the first organic light emitting layer OL1 and the second organic light emitting layer OL2 may be simultaneously deposited on each of the first electrode E1 and the second electrode E2 by using one deposition process using one mask.

Since this acts as a factor reducing total manufacturing time and manufacturing costs of the organic light emitting diode display, even though the organic light emitting diode display 1000 includes the first organic light emitting element OLED1 and the second organic light emitting element OLED2 that emit different blue lights, it is possible to provide the organic light emitting diode display 1000 capable of reducing the manufacturing time and manufacturing costs.

In short, even though the number of masks used for depositing the organic light emitting layer is not increased, the organic light emitting diode display 1000 capable of improving light emission efficiency of each of a plurality of organic light emitting elements that emit lights having different wavelengths is provided.

Hereinafter, an organic light emitting diode display according to another embodiment will be described with reference to FIG. 6. Portions which are different from the organic light emitting diode display according to an embodiment described above will be described.

Figure 6:
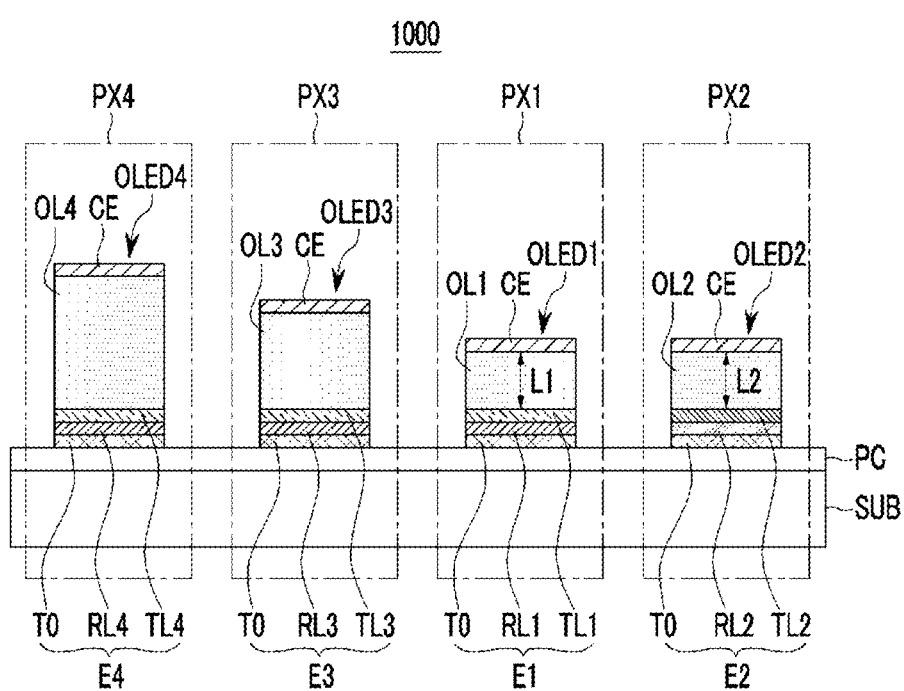
FIG. 6 is a cross-sectional view showing an organic light emitting diode display according to another embodiment.

FIG. 6 is a cross-sectional view showing an organic light emitting diode display according to another embodiment.

As shown in FIG. 6, the second organic light emitting element OLED2 of the organic light emitting diode display 1000 according to another embodiment emits the second blue light having the second wavelength which may be 440 nm to 458 nm shorter than the first blue light having the first wavelength which is emitted by the first organic light emitting element OLED1, and includes a second electrode E2, a second organic light emitting layer OL2, and a common electrode CE.

The second electrode E2 includes a transparent oxide layer TO, a second reflective layer RL2, and a second transparent conductive layer TL2.

The second transparent conductive layer TL2 may be formed of a single layer or multilayer of light transmissive conductive material including one or more of indium tin oxide (ITO), amorphous indium tin oxide (a-ITO), indium zinc oxide (IZO), and the like, and may include a material having a high work function. The second transparent conductive layer TL2 includes a material which is different from that of the first transparent conductive layer TL1 of the first electrode E1. In embodiments, each of the first transparent conductive layer TL1 of the first organic light emitting element OLED1 and the second transparent conductive layer TL2 of the second organic light emitting element OLED2 includes different transparent conductive materials.

As such, since the second transparent conductive layer TL2 of the second electrode E2 includes the transparent conductive material different from that of the first transparent conductive layer TL1 of the first electrode E1, it is possible to suppress the first transparent conductive layer TL1 from being etched by an etchant etching the second transparent conductive layer TL2, when the second electrode E2 is formed by using an additional process after the process of forming the first electrode E1.

In embodiments, since it is suppressed that unwanted defect occurs in the first electrode E1 at the time of the manufacturing process of the second electrode E2, the organic light emitting diode display 1000 having improved reliability of the entire manufacturing process is provided.

Hereinafter, an organic light emitting diode display according to another embodiment will be described with reference to FIG. 7. Portions which are different from the organic light emitting diode display according to an embodiment described above will be described.

Figure 7:
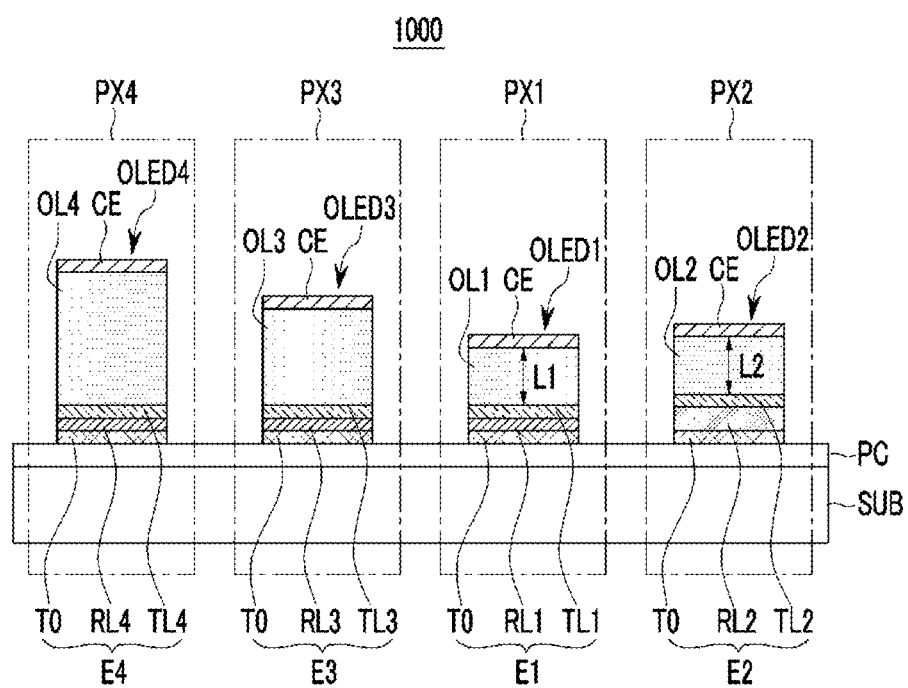
FIG. 7 is a cross-sectional view showing an organic light emitting diode display according to another embodiment.

FIG. 7 is a cross-sectional view showing an organic light emitting diode display according to another embodiment.

As shown in FIG. 7, the second reflective layer RL2 of the second electrode E2 of the second organic light emitting element OLED2 of an organic light emitting diode display 1000 according to another embodiment has a thickness thicker than that of the first reflective layer RL1.

Thereby, since reflectance of the second reflective layer RL2 becomes higher than that of the first reflective layer RL1, purity of the second blue light, which is the deep blue light having the second wavelength of 440 nm to 458 nm emitted by the second organic light emitting element OLED2 is further improved.

In embodiments, the organic light emitting diode display 1000 having improved light emission efficiency of the second organic light emitting element OLED2 is provided.

Hereinafter, an organic light emitting diode display according to another embodiment will be described with reference to FIG. 8. Portions which are different from the organic light emitting diode display according to an embodiment described above will be described.

Figure 8:
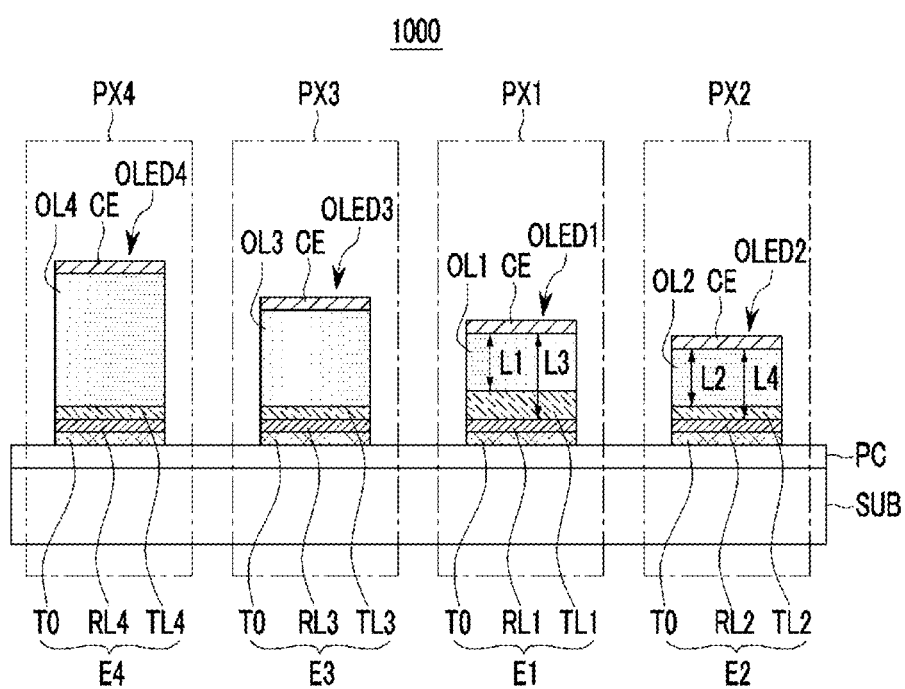
FIG. 8 is a cross-sectional view showing an organic light emitting diode display according to another embodiment.

As shown in FIG. 8, the first organic light emitting element OLED1 of an organic light emitting diode display 1000 according to another embodiment emits the first blue light having the first wavelength which may be 459 nm to 490 nm, and includes the first electrode E1, the first organic light emitting layer OL1, and the common electrode CE.

The first electrode E1 includes a transparent oxide layer TO, a first reflective layer RL1, and a first transparent conductive layer TL1.

The first reflective layer RL1 includes silver Ag, which is a metal having high reflectance. The first reflective layer RL1 reflects light emitted from the first organic light emitting layer OL1 in a direction of the common electrode CE.

The first transparent conductive layer TL1 may be formed of a single layer or multilayer of light transmissive conductive material including one or more of indium tin oxide (ITO), amorphous indium tin oxide (a-ITO), indium zinc oxide (IZO), and the like, and may include a material having a high work function. The first transparent conductive layer TL1 has a thickness substantially greater than that of the second transparent conductive layer TL2 of the second electrode E2 of the second organic light emitting element OLED2.

The first organic light emitting layer OL1 includes at least a main light emitting layer that emits light. In embodiments, the first organic light emitting layer OL1 may further include a hole injection layer, a hole transport layer, an auxiliary layer, an electronic transport layer, and an electronic injection layer. The first organic light emitting layer OL1 includes a blue light emitting material. In embodiments, the first organic light emitting layer OL1 has a thickness which defines a first distance L1 between the first electrode E1 and the common electrode CE. In addition, due to the thick thickness of the first transparent conductive layer TL1, the first reflective layer RL1 of the first electrode E1 and the common electrode CE have a third distance L3 therebetween. Here, the third distance L3 may be an optimal distance at which constructive interference occurs in response to the first blue light having the first wavelength of 459 nm to 490 nm.

The second organic light emitting element OLED2 may emit a second blue light having a second wavelength which may be 440 nm to 458 nm shorter than the first blue light having the first wavelength which is emitted by the first organic light emitting element OLED1, and include a second electrode E2, a second organic light emitting layer OL2, and a common electrode CE.

The second electrode E2 includes a transparent oxide layer TO, a second reflective layer RL2, and a second transparent conductive layer TL2.

The second reflective layer RL2 includes silver Ag, which is the same metal having high reflectance as that of the first electrode E1 of the first organic light emitting element OLED1. The second reflective layer RL2 reflects light emitted from the second organic light emitting layer OL2 in a direction of the common electrode CE.

In embodiments, since the second electrode E2 and the first electrode E1 include the same silver Ag, the second electrode E2 includes the same material as that of the first electrode E1. Since the second electrode E2 includes the same material as that of the first electrode E1, the second electrode E2 may be formed simultaneously with the first electrode E1 by the process of forming the first electrode E1.

The second transparent conductive layer TL2 may be formed of a single layer or multilayer of light transmissive conductive material including one or more of indium tin oxide (ITO), amorphous indium tin oxide (a-ITO), indium zinc oxide (IZO), and the like, and may include a material having a high work function. The second transparent conductive layer TL2 has a thickness substantially smaller than that of the first transparent conductive layer TL1 of the first electrode E1 of the first organic light emitting element OLED1. The second transparent conductive layer TL2 may be formed by using a half-tone mask or may be formed by using an additional deposition process.

The second organic light emitting layer OL2 includes at least a main light emitting layer that emits light. In embodiments, the second organic light emitting layer OL2 may further include a hole injection layer, a hole transport layer, an auxiliary layer, an electronic transport layer, and an electronic injection layer. The second organic light emitting layer OL2 includes the same blue light emitting material as that of the first organic light emitting layer OL1. The second organic light emitting layer OL2 has substantially the same thickness as that of the first organic light emitting layer OL1, and as a result, the second electrode E2 and the common electrode CE are spaced from each other with a second distance L2 substantially the same as the first distance L1. In addition, due to the thin thickness of the second transparent conductive layer TL2, the second reflective layer RL2 of the second electrode E2 and the common electrode CE have a fourth distance L4 substantially shorter than the third distance L3 therebetween. Here, the fourth distance L4 may be an optimal distance at which constructive interference occurs in response to the second blue light having the second wavelength of 440 nm to 458 nm.

As such, in the organic light emitting diode display 1000 according to another embodiment, even though each of the first organic light emitting layer OL1 of the first organic light emitting element OLED1 and the second organic light emitting layer OL2 of the second organic light emitting element OLED2 includes the same blue light emitting material and has the same thickness, and each of the first electrode E1 and the second electrode E2 includes the same material at the same time, since the second transparent conductive layer TL2 of the second electrode E2 has the thickness substantially smaller than that of the first transparent conductive layer TL1 of the first electrode E1, the first reflective layer RL1 of the first organic light emitting element OLED1 and the common electrode CE have the third distance L3 therebetween, and the second reflective layer RL2 of the second organic light emitting element OLED2 and the common electrode CE have the fourth distance L4 therebetween. Thereby, since the blue light emitted from the first organic light emitting layer OL1 generates constructive interference corresponding to the first blue light having the first wavelength of 459 nm to 490 nm and the blue light emitted from the second organic light emitting layer OL2 generates constructive interference corresponding to the second blue light having the second wavelength of 440 nm to 458 nm, the first organic light emitting element OLED1 emits the first blue light, which is the sky blue light having the first wavelength of 459 nm to 490 nm, and the second organic light emitting element OLED2 emits the second blue light, which is the deep blue light having the second wavelength of 440 nm to 458 nm shorter than the first wavelength.

In embodiments, even though each of the first organic light emitting layer OL1 and the second organic light emitting layer OL2 of each of the first organic light emitting element OLED1 and the second organic light emitting element OLED2 has the same material and the same thickness, resonance distances at which constructive interference of each of the first organic light emitting element OLED1 and the second organic light emitting element OLED2 occurs are set to be different from each other by forming the thickness of each of the first transparent conductive layer TL1 and the second transparent conductive layer TL2 to be different from each other. As a result, even though each of the first organic light emitting layer OL1 and the second organic light emitting layer OL2 is simultaneously formed by using one deposition process using one mask, each of the first organic light emitting element OLED1 and the second organic light emitting element OLED2 may be formed to emit different blue lights.

Since this acts as a factor reducing total manufacturing time and manufacturing costs of the organic light emitting diode display, even though the organic light emitting diode display 1000 includes the first organic light emitting element OLED1 and the second organic light emitting element OLED2 that emit different blue lights, it is possible to provide the organic light emitting diode display 1000 capable of reducing the manufacturing time and manufacturing costs.

In short, even though the number of masks used for depositing the organic light emitting layer is not increased, the organic light emitting diode display 1000 capable of improving light emission efficiency of each of a plurality of organic light emitting elements that emit lights having different wavelengths is provided.

What is claimed is:

1. An organic light emitting diode display comprising:
   a first organic light emitting element configured to emit light having a first wavelength; and
   a second organic light emitting element configured to emit light having a second wavelength substantially shorter than the first wavelength,
   wherein the first organic light emitting element comprises a first electrode, and
   wherein the second organic light emitting element comprises a second electrode having substantially higher reflectance for the light having the second wavelength than the first electrode; and further wherein the first organic light emitting element and the second organic light emitting element respectively comprise first and second organic light emitting layers that comprise the same material and have substantially the same thickness, the first and second organic light emitting layers being disposed over the first electrode and the second electrode, respectively.

2. The organic light emitting diode display of claim 1, wherein the first and second electrodes comprise first and second reflective layers, respectively, wherein the second reflective layer of the second electrode comprises a material different from that of the first reflective layer of the first electrode.

3. The organic light emitting diode display of claim 1, wherein the first and second organic light emitting layers comprise a blue light emitting material.

4. The organic light emitting diode display of claim 1, wherein the first organic light emitting element and the second organic light emitting element further comprise a common electrode disposed over the first and second organic light emitting layers, and
   wherein a first distance between the first electrode and the common electrode is substantially the same as a second distance between the second electrode and the common electrode.

5. The organic light emitting diode display of claim 2, wherein the first reflective layer of the first electrode comprises silver (Ag), and the second reflective layer of the second electrode comprises aluminum (Al).

6. The organic light emitting diode display of claim 5, wherein the first electrode comprises a first transparent conductive layer disposed over the first reflective layer, and
   wherein the second electrode does not comprise an intervening transparent conductive layer on the second reflective layer.

7. The organic light emitting diode display of claim 5, wherein the first electrode comprises a first transparent conductive layer disposed over the first reflective layer, and
   wherein the second electrode further comprises a second transparent conductive layer disposed over the second reflective layer.

8. The organic light emitting diode display of claim 7, wherein the first transparent conductive layer and the second transparent conductive layer comprise different transparent conductive materials.

9. The organic light emitting diode display of claim 7, wherein a thickness of the second reflective layer is substantially greater than that of the first reflective layer.

10. The organic light emitting diode display of claim 1, wherein the light having the first wavelength and the light having the second wavelength are blue light.

11. The organic light emitting diode display of claim 10, wherein the first wavelength is about 459 nm to about 490 nm, and the second wavelength is about 440 nm to about 458 nm.

12. The organic light emitting diode display of claim 1, wherein the first organic light emitting element further comprises:
   a first organic light emitting layer disposed over the first electrode; and
   a common electrode disposed over the first organic light emitting layer, and wherein the second organic light emitting element further comprises:
   a second organic light emitting layer disposed over the second electrode; and
   the common electrode disposed over the second organic light emitting layer.

13. The organic light emitting diode display of claim 12, wherein the first organic light emitting layer and the second organic light emitting layer comprise the same material and have substantially the same thickness.

14. The organic light emitting diode display of claim 13, wherein a distance between the first electrode and the common electrode is substantially the same as a distance between the second electrode and the common electrode.

15. The organic light emitting diode display of claim 1, further comprising:
- a third organic light emitting element configured to emit light having a third wavelength longer than the first wavelength; and
- a fourth organic light emitting element configured to emit light having a fourth wavelength longer than the third wavelength.

16. The organic light emitting diode display of claim 15, wherein the third organic light emitting element and the fourth organic light emitting element comprise third and fourth organic light emitting layers having thicknesses different from each other.

17. An organic light emitting diode display comprising:
- a first organic light emitting element configured to emit light having a first wavelength; and
- a second organic light emitting element configured to emit light having a second wavelength substantially shorter than the first wavelength,
- wherein the first organic light emitting element comprises a first reflective layer and a first electrode that comprises a first transparent conductive layer and is disposed over the first reflective layer, and
- wherein the second organic light emitting element comprises a second reflective layer and a second electrode that is disposed over the second reflective layer and comprises a second transparent conductive layer having a thickness substantially smaller than that of the first transparent conductive layer; and further wherein the first organic light emitting element and the second organic light emitting element respectively comprise first and second organic light emitting layers that comprise the same material and have substantially the same thickness, the first and second organic light emitting layers being disposed over the first electrode and the second electrode, respectively.

18. The organic light emitting diode display of claim 17, wherein the first reflective layer and the second reflective layer comprise the same material.

* * * * *